United States Patent [19]

Lins

[11] 4,112,503
[45] Sep. 5, 1978

[54] STRIPE DOMAIN PROPAGATION USING CONTIGUOUS BICORE DISK FILE STRUCTURE

[75] Inventor: Stanley James Lins, Bloomington, Minn.

[73] Assignee: Sperry Rand Corporation, New York, N.Y.

[21] Appl. No.: 785,808

[22] Filed: Apr. 8, 1977

[51] Int. Cl.$^2$ ............................................. G11C 19/08
[52] U.S. Cl. ....................................... 365/29; 365/41; 365/173
[58] Field of Search ................ 340/174 TF, 174 QA, 340/174 ZB; 365/29, 173

[56] References Cited

U.S. PATENT DOCUMENTS

| | | | |
|---|---|---|---|
| 3,125,743 | 3/1964 | Pohm et al. ................. | 340/174 TF |
| 3,541,535 | 11/1970 | Perneski ...................... | 340/174 TF |
| 3,811,120 | 5/1974 | Bobeck ....................... | 340/174 TF |
| 3,887,905 | 6/1975 | Bobeck et al. ............... | 340/174 TF |
| 4,040,040 | 8/1977 | Torre et al. .................. | 340/174 TF |

*Primary Examiner*—Vincent P. Canney
*Attorney, Agent, or Firm*—Kenneth T. Grace; William E. Cleaver; Marshall M. Truex

[57] ABSTRACT

An apparatus for and a method of moving stripe domains in a direction transverse their length is disclosed. The apparatus includes a layer of magnetizable material in which stripe domains are capable of being generated, sustained and moved. Formed upon the magnetizable layer are two parallel contiguous disk files, each of which is formed of a plurality of linearly aligned similar contiguous Bicore disks. Each Bicore disk is comprised of a disk of a relatively soft magnetizable material, e.g., Permalloy, and a superposed disk of a relatively hard magnetizable material, e.g., Cobalt, sandwiching an insulative layer, e.g., silicon dioxide, SiO$_2$, therebetween. The magnetizations of the superposed soft and hard magnetizable disks of each of the Bicore disks are in a closed, antiparallel aligned direction with the magnetization of each of the soft magnetizable disks of the first contiguous disk file directed across the separating stripe domain propagation area and aligned with but oppositely polarized with respect to the magnetization in the associated soft magnetizable disks in the other, second contiguous disk file. A stripe domain is transferred into the propagation device by coupling the two ends thereof to the two corresponding, oppositely polarized aligned first Bicore disks of the two contiguous disk files. An appropriate propagate drive field, which is directed along the direction of propagation of the stripe domain and which is aligned with the two parallel contiguous disk files, rotates only the magnetizations of the soft magnetizable disks in each of the two contiguous disk files, in a like direction, e.g., the soft magnetizable disks in the first contiguous disk file are rotated in a clockwise direction while the magnetizations of the soft magnetizable disks in the second contiguous disk file are rotated in the counterclockwise direction. The rotating magnetization of the soft magnetizable disks of the two Bicore disks, one at each of the two ends of the stripe domain, carries the stripe domain in the direction of the propagate drive field. When the propagate drive field is suddenly terminated, the magnetizations of the soft magnetizable disks snap back under the influence of the magnetization of the hard magnetizable disk while the stripe domain remains in its new, propagated position downstream between contiguous Bicore disks. Upon successive applications of the propagate drive fields, each end of the stripe domain is transferred from an upstream Bicore disk to the next adjacent downstream Bicore disk while all stripe domains in the propagation device are transferred, in parallel, along the two aligned contiguous disk files through the stripe domain propagation area.

7 Claims, 14 Drawing Figures

STRIPE DOMAIN PROPAGATION USING CONTIGUOUS BICORE DISK FILE STRUCTURE

BACKGROUND OF THE INVENTION

In the prior art, it is known that bubble domains may be generated in a magnetizable layer of, e.g., a great epitaxial film. These bubble domains may then be propagated through the magnetizable layer using Permalloy overlays when subjected to a bias field normal to the plane of the magnetizable layer and a rotating in-plane field. For detection of the passage of a bubble domain along the overlay, the bubble domain is generally stretched whereby the bubble domain may be lengthened into a stripe domain increasing the stray flux several orders of magnitude so that electrical signals several millivolts in amplitude are obtained. These lengthened bubble domains or stripe domains may then, under the same bias and in-plane fields, be propagated along parallel lines of discrete Permalloy elements such as the well-known Chevron design. For discussion of such a system see the article "Magnetic Bubbles—An Emerging New Memory Technology", A. H. Bobeck, et al., Proceedings of the IEEE, Volume 63, No. 8, August 1975, pp. 1176–1195, with particular reference to FIG. 14.

In magneto-optic readout devices incorporating bubble memory systems, it is desirable that the area through which the bubble domains are to be propagated be unobstructed by opaque materials such as the commonly used Permalloy material of which the propagating elements such as Chevrons are typically formed. It is therefore desirable that there be provided a means whereby bubble domains and/or stripe domains be propagated through a bubble domain and/or stripe domain sustaining material without providing light obstructing propagation elements along the entire length of the propagating stripe domain.

SUMMARY OF THE INVENTION

The present invention incorporates a derivative of the Bicore—trademark of the Sperry Rand Corporation—element of the Pohm, et al, U.S. Pat. No. 3,125,743, into the contiguous disk file concept of the Bobeck, et al, U.S. Pat. No. 3,516,077, to provide an apparatus for and a method of propagating stripe domains through a magnetizable material. Each of the two ends of each stripe domain is captured by the external magnetic field of a Bicore disk. The individual ends of the stripe domains behave like bubble domains and can be propagated in a manner similar to bubble domains. A drive field rotates, in opposite clockwise, counterclockwise directions but in like downstream direction, the magnetization of the soft magnetizable layers of the Bicore disks at each end of a captured stripe domain. The rotating external magnetic fields of the soft magnetizable disks propagate the captured stripe domain in the direction of rotation, i.e., downstream. When the drive field is terminated, the rotating external magnetic field of each of the soft magnetizable disks quickly returns to its static position in alignment with the non-rotated external magnetic field of the hard magnetizable disk leaving the stripe domain in its propagated downstream position to be captured by the external magnetic field of the soft magnetizable disk of the next adjacent contiguous Bicore disk which is in the direction of propagation, i.e., downstream, as determined by the direction of the drive field. Successive drive field applications move the captured stripe domain along successive contiguous Bicore disks.

DESCRIPTION OF THE PREFERRED EMBODIMENT

Figures 1, 2:
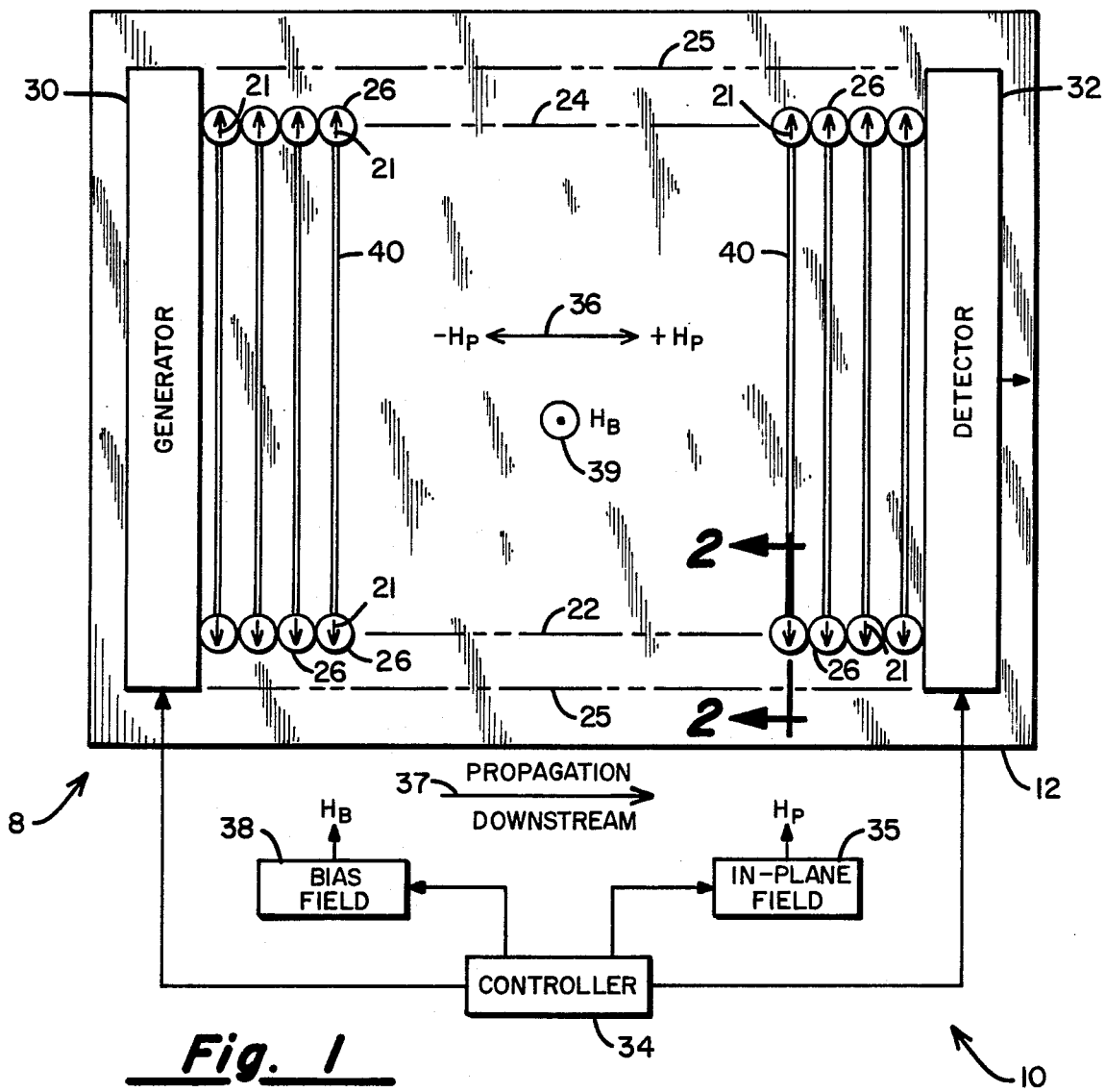
FIG. 1 is a block diagram of a system incorporating the present invention.
FIG. 2 is a cross sectional view of a Bicore disk that is incorporated in the contiguous disk file of FIG. 1.

With particular reference to FIG. 1 there is presented a block diagram of a system 10 incorporating the present invention. The stripe domain propagation system 10 of FIG. 1 includes a memory plane 8 that is preferably formed by the well-known liqiud-phase epitaxy (LPE) method in which there is first generated a non-magnetic garnet support layer or substrate 12 of Gadolinium Gallium Garnet (GGG) of approximately 800 microns ($\mu$m) in thickness. Next, upon support layer 12 there is generated a stripe domain layer 14 of a magnetizable material of 3–10 $\mu$m in thickness in which stripe domains may be generated, sustained and moved about— see FIG. 2. Next, upon stripe domain layer 14 there is formed, by well known vapor deposition techniques, a thin insulative layer 15 of silicon dioxide ($SiO_2$) of 0.3–1.5 $\mu$m in thickness. Next, upon insulative layer 15 there are formed, by the well-known vapor deposition technique such as that disclosed in the S. M. Rubens, et al, U.S. Pat. No. 3,030,612, a plurality of relatively soft, i.e., low magnetic retentivity, magnetizable materials, such as Permalloy of 18% Ni–92% Fe, having circular or disk-like planar contours.

A like plurality of identical disks 16 are formed in a contiguous manner along the two parallel longitudinal axes for forming two contiguous disk files 22, 24 somewhat similar to that of the A. H. Bobeck, et al, U.S. Pat. No. 3,516,077. Next, upon each of the Permalloy disks 16 there is deposited a thin insulative layer 18 of silicon dioxide ($SiO_2$). Finally, upon insulative layer 18 there is formed, by the well-known vapor deposition process as utilized to form the Permalloy disks 16, a relatively hard, i.e., high magnetic retentivity, magnetizable layer 20 of Cobalt in which there is formed, during the deposition thereof, an anisotropic or easy axis 21. Axis 21 is oriented orthogonal to the longitudinal axes of the contiguous disk files 22, 24 and is linearly aligned with the like easy axis 21 of a similarly disposed Cobalt disk 20 similarly positioned in contiguous disk files 22, 24. The magnetizations M of the Cobalt layers 20 that form the contiguous disk files 22 and 24 are aligned in an antiparallel manner denoted by vectors 21 in FIG. 1.

The Permalloy disk 16 and the Cobalt disk 20 form a Bicore disk similar to that of the A. V. Pohm, et al, U.S. Pat. No. 3,125,743, in which the Permalloy disk 16 and the Cobalt disk 20 of each Bicore disk 26 partially close the otherwise open flux path of the other with the external magnetic field of the Cobalt layer 20 causing the magnetization of the Permalloy disk 16 to be aligned antiparallel therewith except when effected by an external drive field of the appropriate intensity and direction. Also formed in stripe domain layer 40 is a containment barrier 25 for defining the limits of the active or stripe domain propagation area.

Formed integral with substrate 12 is a stripe domain generator 30, for the generation and the coupling of stripe domains to the contiguous disk files 22 and 24, and a stripe domain detector 32 for the detection of the stripe domains as they are propagated through the stripe domain area and coupled thereto by the rightmost downstream Bicore disks 26 of contiguous disk files 22 and 24. Also provided is a controller 34 for coupling the appropriate control signals to stripe domain generator 30 and stripe domain detector 32 and to in-plane field generator 36 for coupling the bipolar in-plane field $H_P$ to system 10, as denoted by vector 36, in the direction of propagation of the stripe domains 40 as denoted by the vector 37 and to bias field $H_B$ generator 38 for coupling the steady state bias field $H_B$ to system 10 in a direction normal to the plane of support layer 12 as denoted by the dot and concentric circle 39.

With particular reference to FIG. 2 there is presented a cross-sectional view of a Bicore disk 26 that is incorporated in the contiguous disk files 22, 24 of the stripe domain propagation system 10 as taken along 2—2 of FIG. 1. In this configuration of FIG. 2 it can be seen that the Permalloy disk 16, the insulator disk 18 and the Cobalt disk 20 are in a stacked, superposed, integral assembly forming Bicore disk 26 in which the remanent magnetization M of Permalloy disk 16, identified by vector 17, and the remanent magnetization M (and also the easy axis) of the Cobalt disk 20, identified by vector 21, are oriented in an aligned antiparallel, superposed manner. Insulative disk 18 is of the proper thickness so as to substantially eliminate exchange coupling but to permit magnetostatic coupling between Cobalt disk 20 and Permalloy disk 16. The remanent magnetization M is aligned along the easy axis of the Cobalt disk 20 and is of such a coercive force $H_K$ such that it is substantially unaffected by the applied drive field $H_P$ which is a field that is applied coplanar with or in the plane of stripe domain layer 14 and that is directed orthogonal to the easy axis 21 of Cobalt layer 20 but parallel to the direction of propagation of stripe domains 40 through stripe domain layer 14 as denoted by vector 37 of FIG. 1. In contrast, the Permalloy disk 16 may have an axis of anisotropy aligned with that of the axis of anisotropy of the Cobalt disk 20; however it has a sufficiently low anisotropy field $H_K$ such that it is substantially effected by the drive field $H_P$. Thus it may be easy rotated out of alignment with the easy axis of Cobalt disk 20 but with a zero intensity drive field $H_P$ returns to an antiparallel alignment with the external remanent magnetization of Cobalt disk 20 as determined by the external remanent magnetic field of Cobalt disk 20 that is aligned with its easy axis 21 of anisotropy.

Figure 3:
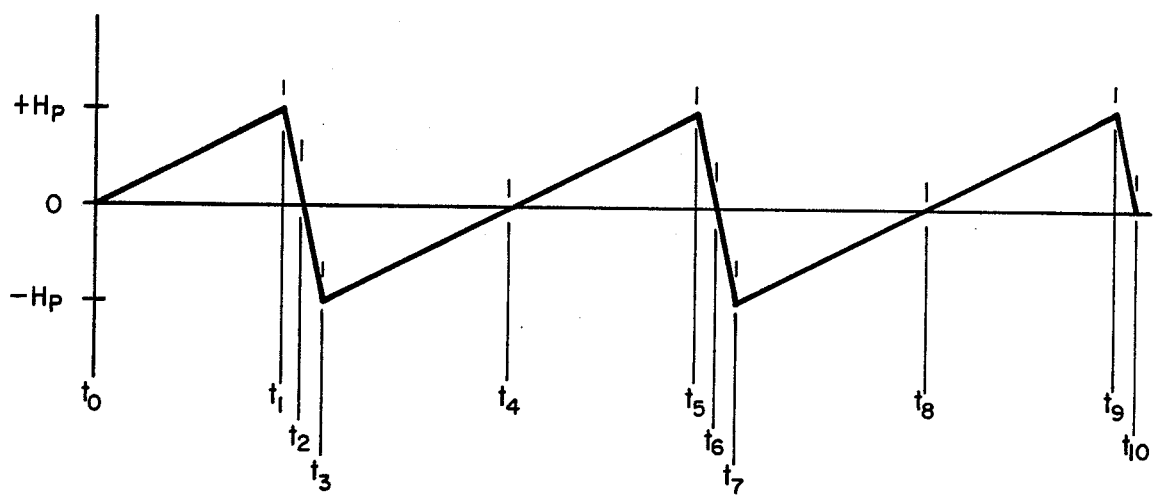
FIG. 3 is an illustration of the waveform of the drive signal that is utilized by the system of FIG. 1.

With particular reference to FIG. 3 there is presented an illustration of the waveform of the drive field $H_P$ that is utilized by the stripe domain propagation system 10 of FIG. 1. Additionally, with particular reference to FIGS. 4a–4k there are presented illustrations of effects of the waveform of the drive field $H_P$ of FIG. 3 upon the rotation of the magnetization M of the Bicore disk 26 and the resulting propagation of the captured stripe domains 40 of FIG. 1.

The operation of the system 10 of FIG. 1 consists of the process of coupling an in-plane drive field $H_P$ that is directed parallel to vector 37 of FIG. 1 which is the direction of propagation of the stripe domains 40 and that is in the plane of stripe domain layer 14 for causing the magnetization 17 of the Permalloy disks 16 of the Bicore disks 26 to oscillate about the easy axis 21 of the Cobalt disk 20. This oscillation of the magnetization 17 of the Permalloy disks 16 causes an associated end of the stripe domain 40, in its upstream position, to propagate in the direction of vector 37 under the influence of the relatively slow rise time leading edge of the in-plane drive field $H_P$. In contrast, the relatively fast fall time trailing edge of the in-plane drive field $H_P$ is too fast to maintain the capture of the associated end of the stripe domain 40 and to return it to its original upstream position such that stripe domain 40 escapes from the potential well formed by stripe domain 40 and is left behind in its propagated position downstream between the contiguous Bicore disks 26. The too fast rotating magnetization 17 rotates back past the easy axis 21 of Cobalt layer 20 to capture the end of the next upstream stripe domain 40 that is positioned in its upstream position in preparation for the next leading edge of the in-plane drive field $H_P$ which will, as before, propagate the captured stripe domain 40 into its propagated downstream position. This repetition of the relatively slow rise time leading edge and the relatively fast full time trailing edge of the in-plane drive field $H_P$, successively, from the upstream position to the downstream position of each associated Bicore disk 26, propagates the captured stripe domains 40 from each contiguous Bicore disk 26 such that the captured ends of the respective stripe domains 40 are propagated along contiguous disk file 22 and 24, respectively, from left to right, downstream through the stripe domain area of system 10 of FIG. 1.

FIGS. 4a through 4k are presented as diagrammatic illustrations of the effects of the waveform of the in-plane drive field $H_P$ of FIG. 3, each figure illustrating the rotated position of the magnetization 17 of the Permalloy disk 16 of a Bicore disk 26 of contiguous disk file 22 when subjected to the in-plane drive field $H_P$ waveform of FIG. 3 at the respectively noted times: Note that magnetization 21 of cobalt disk 20 remains relatively unaffected by the drive field $H_P$.

Figure 4A:
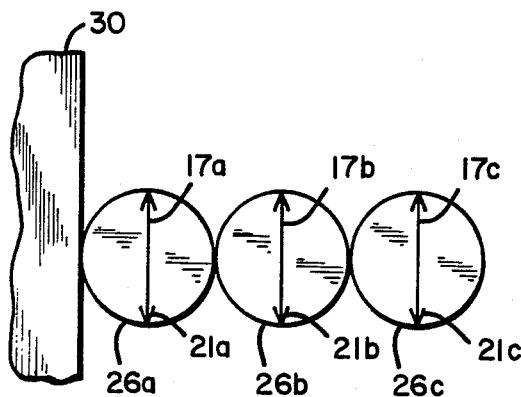
FIGS. 4a through 4k are illustrations of the effects of the waveform of FIG. 3 upon the rotation of the magnetization of the Bicore disks and the resulting propagation of the captured stripe domains of FIG. 1.

With particular reference to FIG. 4a there are illustrated the positions of the magnetization vectors 17a, 17b, 17c of the Bicore disks 26a, 26b, 26c, respectively, when upon time $t_0$ system 10 of FIG. 1 is subjected to a drive field $H_P$ of 0 intensity—see FIG. 3. At this time, the magnetization vectors 17a, 17b, 17c are aligned with and are superposed to the magnetization vectors 21a, 21b, 21c along the easy axes of Cobalt disks 20a, 20b, 20c, respectively—see FIG. 2.

Figure 4B:
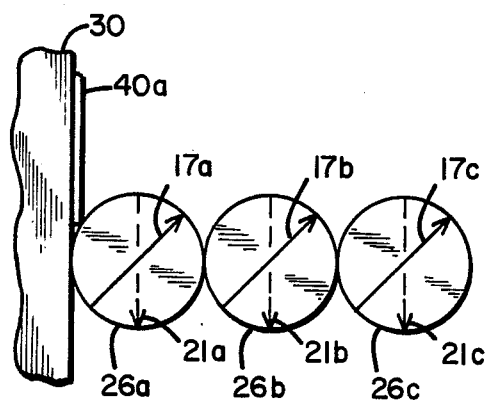

Next, during the time $t_0$-$t_1$—see FIG. 3—drive field source 35 couples a drive field $H_P$, having a very slow rise time leading edge, to system 10. The maximum intensity +$H_P$ of the drive field $H_P$—as at time $t_1$—is sufficient to rotate the magnetization of the Permalloy disks 16 toward a downstream direction; however, the magnetization of the Cobalt disks 20 is substantially unaffected. FIG. 4b illustrates this condition as at time $t_1$ when the magnetization vectors 17a, 17b, 17c of the Permalloy disks 16 are rotated approximately 45° clockwise—note that the magnetization vectors 17 of the correspondingly positioned Permalloy disks 16 of contiguous disk file 24 are concurrently rotated in a counterclockwise direction downstream. At this time, $t_1$, stripe domain 40a, not having been captured by the magnetization of the Permalloy disk 16 remains in its initial upstream position with respect to Bicore disk 26a.

Figure 4C:
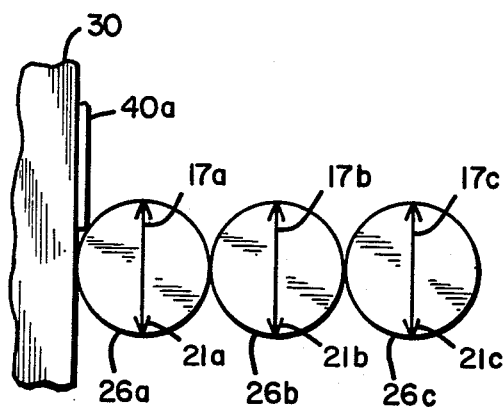
Figure 4D:
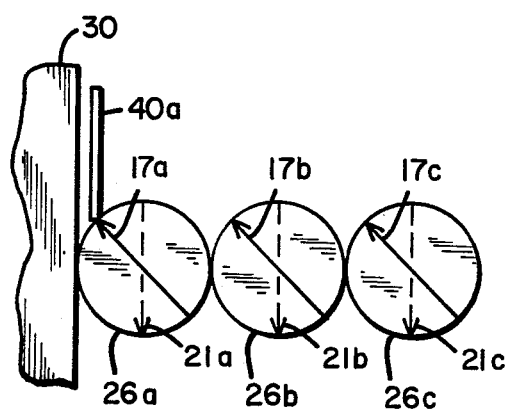

Next, during the time $t_1$-$t_2$-$t_3$ drive field source 35 couples to system 10 a decreasing intensity drive field $H_P$ having a very fast fall time trailing edge moving from the maximum positive intensity $+H_P$ to the maximum negative intensity $-H_P$ over a very short time span. This is as illustrated in FIGS. 4b, 4c, 4d, during which time, $t_1$-$t_2$-$t_3$, the magnetization vectors 17a, 17b, 17c rapidly rotate or snap back to a counterclockwise position of approximately 45° as illustrated in FIG. 4d. Thus at time $t_3$, stripe domain 40a is captured by the magnetization of Permalloy disk 16a of Bicore disk 26a.

Figure 4E:
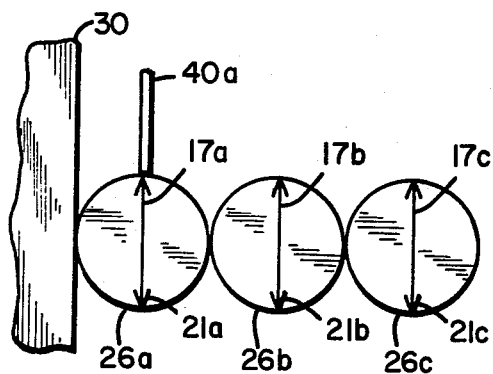
Figure 4F:
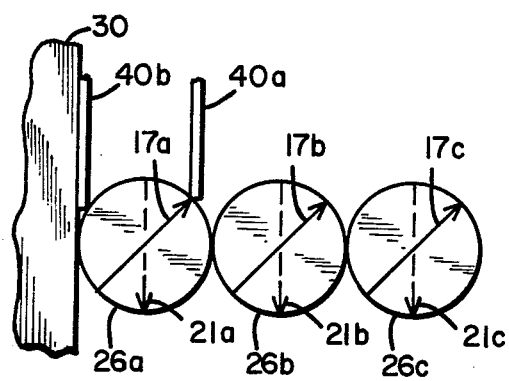

Next, during the time $t_3$-$t_4$-$t_5$ drive field source 35 couples to system 10, an increasing intensity drive field $H_P$ having a very slow rise time leading edge moving from the maximum negative intensity $-H_P$ to the maximum positive intensity $+H_P$ over a very long time span. This is as illustrated in FIGS. 4d, 4e, 4f, during which time, $t_3$-$t_4$-$t_5$, the magnetization vectors 17a, 17b, 17c slowly rotate back to a clockwise position of approximately 45° as illustrated in FIG. 4f. Thus, at time $t_5$, the captured stripe domain 40a has been captured by the magnetization of Permalloy disk 16a of Bicore disk 26a and it has been propagated from the upstream edge to the downstream edge of Bicore disk 26a—now situated between contiguous Bicore disks 26a and 26b—while concurrently at time $t_5$, a stripe domain 40b is positioned by generator 30 at the upstream edge of contiguous disk file 22 as represented by Bicore disk 26a.

Figure 4G:
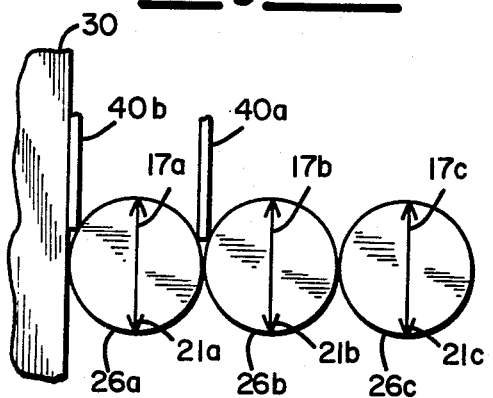
Figure 4H:
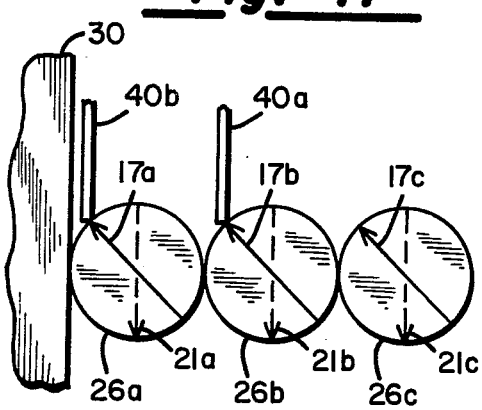

Next, during the time $t_5$-$t_6$-$t_7$ drive field source 35 couples to system 10 a decreasing intensity drive field $H_P$ having a very fast fall time trailing edge, moving from the maximum positive intensity $+H_P$ to a maximum negative intensity $-H_P$ over a very short time span. This is as illustrated in FIGS. 4f, 4g, 4h, during which time, $t_5$-$t_6$-$t_7$, the magnetization vectors 17a, 17b, 17c rapidly rotate or snap back to a counterclockwise position of approximately 45° as illustrated in FIG. 4h. Thus, at time $t_7$ stripe domain 40a is captured by the magnetization of Permalloy disk 16b of Bicore disk 26b while stripe domain 40b is captured by the magnetization of Permalloy disk 16a of Bicore disk 26a.

Figure 4I:
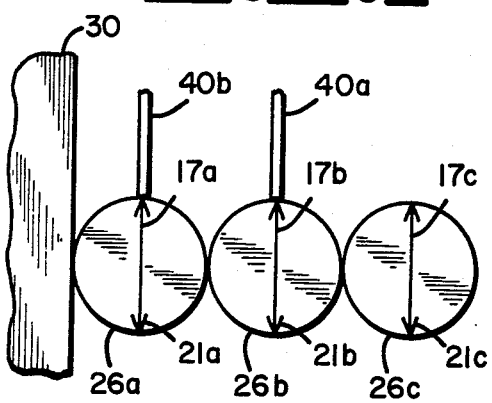
Figure 4J:
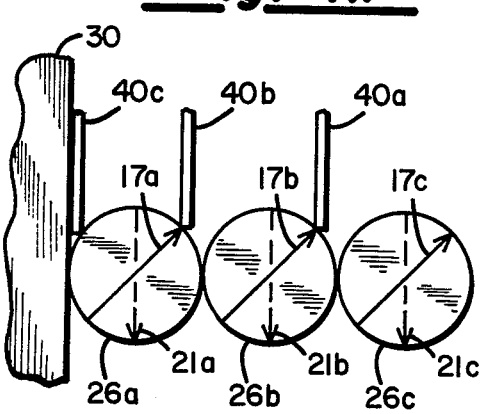
Figure 4K:
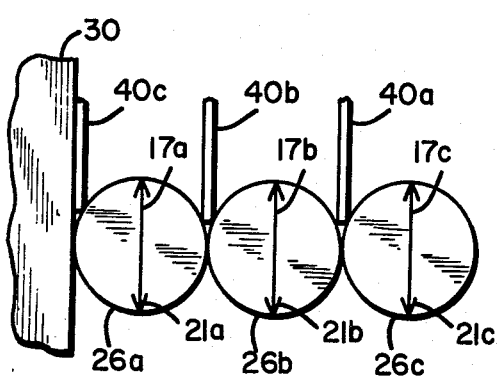

Next, during the time $t_7$-$t_8$-$t_9$ drive field source 35 couples to system 10 an increasing intensity drive field $H_P$ having a very slow rise time leading edge, noving from the maximum negative intensity $-H_P$ to a maximum positive intensity $+H_P$ over a very long time span. This is as illustrated in FIGS. 4h, 4i, 4j, during which time, $t_7$-$t_8$-$t_9$, the magnetization vectors 17a, 17b, 17c slowly rotate back to a clockwise position of approximately 45° as illustrated in FIG. 4j. Thus, at time $t_9$ the captured stripe domains 40a and 40b have by the magnetization of Permalloy disks 16b and 16a of Bicore disks 26b and 26a, respectively, been propagated from the upstream edges to the downstream edges of Bicore disks 26b and 26a—now situated between Bicore disks 26c, 26b, and 26b, 26a, respectively—while concurrently at time $t_9$, stripe domain 40c is positioned by generator 30 at the upstream edge of contiguous disk file 22 as represented by Bicore disk 26a. Subsequently, as at time $t_{10}$—see FIG. 4k—when drive field source 35 couples a drive field $H_P$ of 0 intensity to system 10, stripe domains 40a, 40b are positioned in the areas of the contiguous edges of Bicore disks 26c, 26b and 26b, 26a, respectively.

Accordingly, it is apparent that by application of the bipolar, oppositely directed very slowly rising leading edge and the very quickly falling trailing edge waveform of FIG. 3, stripe domain 40, generated by generator 30 at the upstream end of the stripe domain area defined by the area between contiguous disk files 22 and 24, are propagated in a downstream direction as indicated by vector 37 from generator 30 to detector 32. The theory of operation of such method whereby the movement of the stripe domains 40 through layer 14 lags behind the rotation of the magnetization M of the Permalloy disks 16 during the very quickly falling trailing edge waveform of FIG. 3 is more fully discussed in the text "Magnetic Bubbles", T. H. O'Dell, John Wiley & Sons, pp. 98-114. Also, it is apparent that opposite ends of each stripe domain 40 are concurrently captured by and propagated downstream by like positioned, oppositely magnetically oriented Bicore disks 26 of contiguous disk files 22 and 24.

What is claimed is:

1. A stripe domain propagation system, comprising:
   a non-magnetic substrate;
   a stripe domain layer of a material capable of sustaining stripe domains and having a stripe domain propagation axis in the plane thereof;
   two substantially similar contiguous disk files parallelly aligned along said propagation axis and separated for forming a stripe domain area therebetween through which stripe domains are to be propagated in said magnetizable layer in a downstream propagation direction along said propagation axis, each of said contiguous disk files comprised of;
   a plurality of Bicore disks aligned in contiguous series along said propagation axis, each of said Bicore disks comprising,
      a relatively hard magnetizable disk having an axis of anisotropy oriented transverse to said propagation axis;
      a relatively soft magnetizable disk for providing a closed flux path for the otherwise open flux path of the external field of said relatively hard magnetizable disk, the external field of said relatively hard magnetizable disk orienting the magnetization of said relatively soft magnetization disk antiparallel therewith except when effected by an appropriate drive field; and,
      an insulative layer sandwiched between said relatively soft and hard magnetizable layer for providing magnetostatic coupling therebetween;
   a stripe domain in said stripe domain layer having each of its two ends associated with an associated one of said relatively soft magnetizable disks in the associated one of said two contiguous disk files;
   drive field means coupling a bipolar drive field directed along said propagation axis, said drive field having a relatively slowly increasing leading edge and a relatively quickly decreasing trailing edge, said trailing edge rotating the magnetization of said two end associated relatively soft magnetizable disks out of alignment with the axis of anisotropy of said relatively hard magnetizable disks toward a direction opposite to said propagation direction for capturing the ends of said stripe domain at an upstream position, said leading edge then rotating the magnetization of said two end associated relatively soft magnetizable disks toward said propagation direction and propagating said captured stripe domain in said propagation direction from said upstream position to a downstream position, and then said trailing edge rotating the magnetization of said two end associated relatively soft magnetizable disks quickly back toward said direction opposite to said propagation direction for leaving said captured stripe domain behind in said propagated downstream position to be captured and propagated by the magnetization of the next downstream two end associated relatively soft magnetization disks upon the occurrence of the next successive leading edge of said drive field.

2. A stripe domain propagation system, comprising:
a stripe domain layer of a material capable of sustaining stripe domains and having a stripe domain propagation axis in the plane thereof;
two substantially similar contiguous disk files parallelly aligned along said propagation axis and separated for forming a stripe domain area therebetween through which stripe domains are to be propagated in said magnetizable layer in a downstream or propagation direction along said propagation axis, each of said contiguous disk files comprised of;
  a plurality of layered elements aligned in a contiguous series along said propagation axis, each of said layered elements comprising;
    at least one relatively hard magnetizable layer having an axis of anisotropy oriented transverse to said propagation axis;
    at least one relatively soft magnetizable layer for providing a closed flux path for the otherwise open flux path of the external field of said relatively hard magnetizable layer, said external field of said relatively hard magnetizable layer orienting the magnetization of said relatively soft magnetizable layer therewith except when affected by an appropriate drive field; and,
    an insulative layer, sandwiched between said relatively soft and hard magnetizable layers, of a thickness for providing magnetostatic coupling between said hard and soft magnetizable layers;
a stripe domain in said stripe domain layer having each of its two ends associated with an associated one of said relatively soft magnetizable layers in the associated one of said two contiguous disk files;
drive field means coupling a bipolar drive field directed along said propagation axis, said drive field having a relatively slowly increasing leading edge and a relatively quickly decreasing trailing edge, the trailing edge rotating the magnetization of said two end associated relatively soft magnetizable layers out of alignment with the axis of anisotropy of said relatively hard magnetizable layers into an upstream direction, toward a direction opposite to said downstream or propagation direction, for capturing the ends of said stripe domain at an upstream position, the next following leading edge then rotating the magnetization of said two end associated relatively soft magnetizable layers toward said downstream direction and propagating said captured stripe domain in said downstream direction from said upstream position to a downstream position, and then the next following trailing edge rotating the magnetization of said two end associated relatively soft magnetizable layers quickly back toward said upstream direction for leaving said captured stripe domain behind in said downstream position to be captured and propagated by the magnetization of the downstream, next adjacent two end associated relatively soft magnetization layers upon the occurrence of the next following leading edge of said drive field.

3. A method of propagating stripe domains in a downstream direction, comprising:
generating, in a magnetizable layer, a stripe domain having two ends that define the length thereof;
positioning the two ends of said stripe domain in an upstream position adjacent two end associated magnetizable layers;
coupling a first polarity, which first polarity is antiparallel to said downstream direction, drive field to said two end associated magnetizable layers for rotating the magnetizations thereof in an upstream direction;
capturing the two ends of said stripe domain that is in said upstream position by said upstream direction rotated magnetizations;
coupling a second polarity, which second polarity is parallel to said downstream direction, drive field to said two end associated magnetizable layers for rotating the magnetizations thereof from said upstream direction into a downstream direction;
moving said captured stripe domain from said upstream position into a downstream position by said rotating magnetizations;
coupling said first polarity drive field to said two end associated magnetizable layers for rotating the magnetizations thereof from said downstream direction into said upstream direction;
said upstream direction rotating magnetizations leaving said stripe domain in said downstream position for allowing said stripe domain to escape therefrom.

4. The method of claim 3 further including:
coupling magnetic fields to each of said two end associated magnetizable disks that tend to keep the magnetizations thereof antiparallelly aligned and orthogonal to said downstream propagation direction except when affected by said first and second polarity signals.

5. A method of propagating stripe domains in a downstream direction, comprising:
generating, in a magnetizable layer, a stripe domain having two ends that define the length thereof;
positioning the two ends of said stripe domain in an upstream position adjacent two end associated magnetizable layers with said stripe domain length orthogonal to said downstream direction;
coupling a first polarity, which first polarity is antiparallel to said downstream direction, relatively quickly decreasing drive field to said two end associated magnetizable layers for relatively quickly rotating the magnetizations thereof in an upstream direction;
capturing the two ends of said stripe domain that is in said upstream position by said upstream direction rotated magnetizations;
coupling a second polarity, which second polarity is parallel to said downstream direction, relatively slowly increasing drive field to said two end associated magnetizable layers for relatively slowly rotating the magnetizations thereof from said upstream direction into a downstream direction;
moving said captured stripe domain from said upstream position into a downstream position by said rotating magnetizations;
coupling said first polarity relatively quickly decreasing drive field to said two end associated magnetizable layers for relatively quickly rotating the magnetizations thereof from said downstream direction into said upstream direction;
said relatively quickly upstream direction rotating magnetizations leaving said stripe domain in said downstream position for allowing said stripe domain to escape therefrom.

6. The method of claim 5 further including:
coupling magnetic fields to each of said two end associated magnetizable disks that tend to keep the magnetizations thereof antiparallelly aligned and orthogonal to said downstream propagation direction except when affected by said first and second polarity signals.

7. A method of propagating stripe domains in a downstream direction, comprising:
   a. generating in a stripe domain layer a stripe domain having two ends;
   b. generating two end associated magnetic fields;
   c. aligning the magnetization of said two end associated magnetic fields antiparallel;
   d. coupling each end of said stripe domain to the influence of an associated one of said two end associated magnetic fields;
   e. coupling a drive field to said two end associated magnetic fields for oscillating said two end associated magnetic fields in alternating upstream and downstream directions;
   f. capturing said two ends of said stripe domains by said two end associated magnetic fields when in their upstream direction;
   g. propagating said captured stripe domain from said upstream direction to said downstream direction when said two end associated magnetic fields oscillate from their upstream direction to their downstream direction;
   h. releasing said two ends of said stripe domain from the influence of said two end associated magnetic fields in their downstream directions when said two end associated magnetic fields oscillate from their downstream direction to their upstream direction;
   i. repeating steps (f), (g), and (h) for propagating said stripe domain through said stripe domain layer upon successive oscillations of said two end associated magnetic fields.

* * * * *

UNITED STATES PATENT AND TRADEMARK OFFICE
CERTIFICATE OF CORRECTION

PATENT NO. : 4,112,503
DATED : September 5, 1978
INVENTOR(S) : STANLEY JAMES LINS It is certified that error appears in the above-identified patent and that said Letters Patent are hereby corrected as shown below:

Column 1, Line 7, "great" should be -- garnet --.

Signed and Sealed this

Seventeenth Day of April 1979

[SEAL]

Attest:

RUTH C. MASON
Attesting Officer

DONALD W. BANNER
Commissioner of Patents and Trademarks